United States Patent
Chen et al.

(10) Patent No.: US 8,952,497 B2
(45) Date of Patent: Feb. 10, 2015

(54) SCRIBE LINES IN WAFERS

(75) Inventors: U-Ting Chen, Wanluan Township (TW);
Dun-Nian Yaung, Taipei (TW);
Jen-Cheng Liu, Hsin-Chu (TW);
Feng-Chi Hung, Chu-Bei (TW);
Jeng-Shyan Lin, Tainan (TW);
Shuang-Ji Tsai, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/619,705

(22) Filed: Sep. 14, 2012

(65) Prior Publication Data
US 2014/0077320 A1    Mar. 20, 2014

(51) Int. Cl.
*H01L 21/78* (2006.01)
*H01L 23/00* (2006.01)

(52) U.S. Cl.
CPC .............. *H01L 21/78* (2013.01); *H01L 23/562* (2013.01)
USPC ............ 257/620; 257/E23.179; 257/E23.194; 257/E23.193; 257/E21.602

(58) Field of Classification Search
CPC ................. H01L 23/585; H01L 21/78; H01L 2223/5446; H01L 23/544; H01I 21/78; H01I 23/562

USPC .................. 257/508, 620, E21.602, E23.194, 257/E23.179, E23.193
See application file for complete search history.

(56) References Cited

U.S. PATENT DOCUMENTS

| | | | |
|---|---|---|---|
| 6,521,975 B1 | 2/2003 | West et al. | |
| 7,129,566 B2 * | 10/2006 | Uehling et al. | 257/620 |
| 7,939,913 B2 * | 5/2011 | Watanabe et al. | 257/620 |
| 7,952,167 B2 * | 5/2011 | Lee et al. | 257/618 |
| 8,193,614 B2 * | 6/2012 | Yamada et al. | 257/620 |
| 2002/0038890 A1 | 4/2002 | Ohuchi | |
| 2003/0213953 A1 | 11/2003 | Sohn et al. | |
| 2010/0078769 A1 * | 4/2010 | West et al. | 257/620 |
| 2010/0207251 A1 * | 8/2010 | Yu et al. | 257/620 |

FOREIGN PATENT DOCUMENTS

| | | |
|---|---|---|
| JP | 200123937 | 1/2001 |
| JP | 2008283216 | 11/2008 |
| KR | 100466984 | 1/2005 |
| KR | 1020060104882 | 10/2006 |

* cited by examiner

*Primary Examiner* — John C Ingham
(74) *Attorney, Agent, or Firm* — Slater & Matsil, L.L.P.

(57) ABSTRACT

A wafer includes a plurality of chips arranged as rows and columns. A first plurality of scribe lines is between the rows of the plurality of chips. Each of the first plurality of scribe lines includes a metal-feature containing scribe line comprising metal features therein, and a metal-feature free scribe line parallel to, and adjoining, the metal-feature containing scribe line. A second plurality of scribe lines is between the columns of the plurality of chips.

20 Claims, 5 Drawing Sheets

SCRIBE LINES IN WAFERS

BACKGROUND

Integrated circuit (IC) manufacturers are employing increasingly smaller dimensions and corresponding technologies to make smaller, high-speed semiconductor devices. Along with these advancements, the challenges of maintaining yield and throughput have also increased.

A semiconductor wafer typically includes dies (also known as chips before being sawed from the wafer) separated from each other by scribe lines. Individual chips within the wafer contain circuitry, and the dies are separated from each other by sawing. In a semiconductor fabrication process, semiconductor devices (e.g., an integrated circuit) on wafers must be continuously tested after some steps of the formation so as to maintain and assure device quality. Usually, a test circuit is simultaneously fabricated on the wafer along with the actual devices. A typical test circuit includes a plurality of test pads (commonly referred to test lines), which are electrically coupled to an external terminal through probe needles during the testing. The test pads may be located in the scribe lines. The test pads are selected to test different properties of the wafers, such as threshold voltages, saturation currents, and leakage currents. In addition to the test pads, there are other structures such as frame cells, dummy metal patterns, and the like, formed in the scribe lines.

After the testing of wafers through test pads, the wafers are sawed apart into dies, which sawing step is typically performed by using a blade. Since the test pads are formed of metals, the test pads have high resistance to the blade. On the other hand, there is a plurality of other materials that are also located in the scribe line, which include, for example, low-k dielectric layers. The low-k dielectric layers are porous and mechanically weak, and have very low resistance to the blade. Due to the difference in the mechanical strength between different materials that are sawed, lamination or crack may occur.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A scribe line structure is provided in accordance with various exemplary embodiments. Variations of the embodiments are discussed. Throughout the various views and illustrative embodiments, like reference numbers are used to designate like elements.

Figure 1:
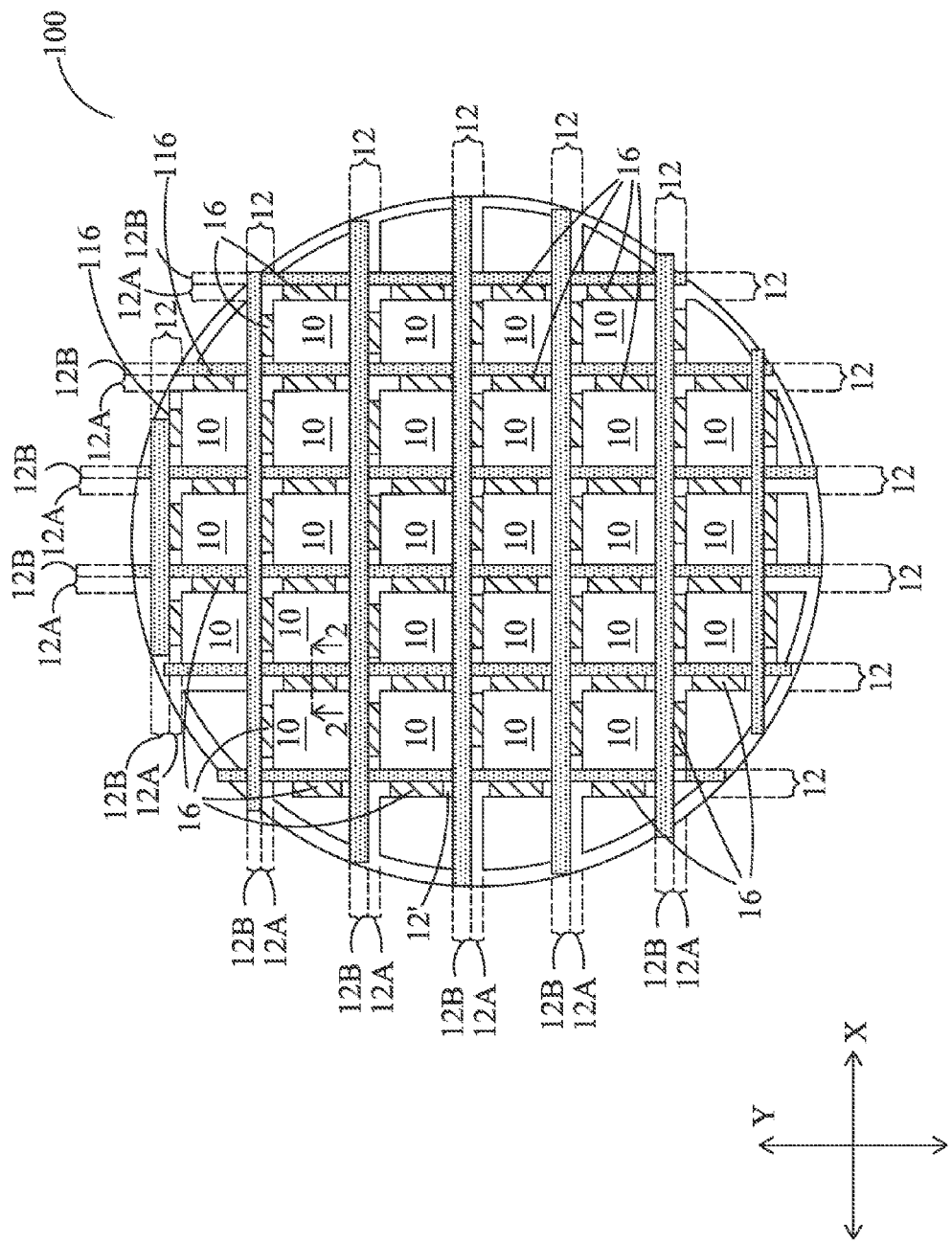
FIG. 1 illustrates a top view of a wafer in accordance with some exemplary embodiments, wherein each of scribe lines includes a metal-pattern containing scribe line and a metal-pattern free scribe line.

FIG. 1 illustrates a top view of wafer 100 in accordance with some exemplary embodiments. Wafer 100 includes chips 10 and the adjoining scribe lines 12. In each of chips 10, seal ring 14 (FIGS. 2 and 3) is formed. In some embodiments, there may be more than one seal ring (although one is shown), wherein outer seal rings encircle inner seal rings. In these embodiments, seal ring 14 is the outmost seal ring among the plurality of seal rings in each of chips 10, and scribe lines 12 are portions of the wafer 100 that are between seal rings 14 of the chips 10 in neighboring rows and columns. Accordingly, each of the scribe lines 12 is between and adjoining two rows (or two columns) of chips 10, and may be between and adjoining two rows (or two columns) of seal rings 14.

Each of scribe lines 12 includes two parallel scribe lines, namely scribe line 12A and scribe line 12B, which adjoin each other. Each of scribe lines 12A and scribe line 12B also adjoins one row or one column of chips 10.

Scribe lines 12A are not used for die-saw, wherein the kerves generated in the subsequently performed die-saw process do not pass through scribe lines 12A. Scribe lines 12A comprise metal patterns 16 therein, wherein metal patterns 16 may include test pads, frame cells, dummy patterns, and/or the like. For example, the test pads are used for probing purpose. The frame cells are used for inline monitoring, such as the inline monitoring of the overlay between different layers and the inline monitoring of the critical dimensions of gate electrodes (not shown). The dummy patterns are formed simultaneously with other metal features such as copper lines 30 and vias 32 in low-k dielectric layers 24 (refer to FIGS. 2 and 3). Throughout the description, scribe lines 12A are alternatively referred to as metal-pattern containing scribe lines 12A.

Scribe lines 12B are used for die-saw, wherein the kerves generated in the die-saw process pass through scribe lines 12B to separate chips 10. Scribe lines 12B are substantially free from, or fully free from, metal patterns formed therein, wherein the metal patterns include test pads, frame cells, dummy patterns, and the like. Accordingly, scribe lines 12B are substantially copper line free, aluminum line free, and contact plugs free. Throughout the description, scribe lines 12B are alternatively referred to as metal-pattern free scribe lines 12B.

Metal-pattern free scribe lines 12B and metal-pattern containing scribe lines 12A form overlap regions 12'. Although one overlap region 12' is illustrated in FIG. 1, overlap regions 12' are located wherever metal-pattern free scribe lines 12B cross metal-pattern containing scribe lines 12A. The overlap regions 12' are also metal-pattern free. Accordingly, it can also be considered that each of metal-pattern free scribe lines 12B extends continuously from one end of wafer 100 to the opposite end with not break therein, while each of metal-pattern containing scribe lines 12A is separated into a plurality of pieces by the metal-pattern free scribe lines 12B that are perpendicular to it.

Figure 2:
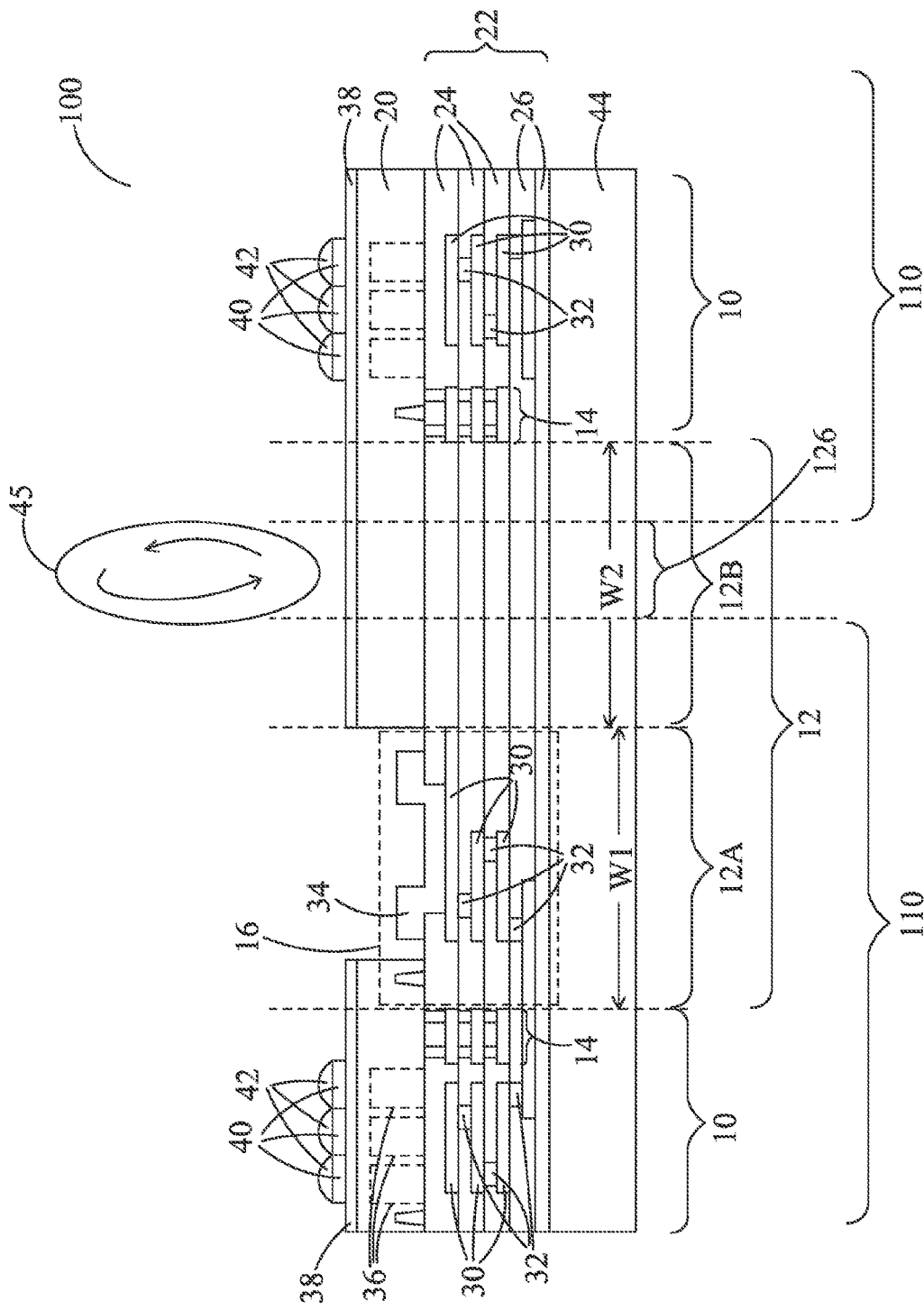
FIGS. 2 and 3 are exemplary cross-sectional views of a portion of the wafer shown in FIG. 1.

FIG. 2 illustrates a cross-sectional view of a portion of wafer 100, wherein the cross-sectional view is obtained from the plane crossing line 2-2 in FIG. 1. Wafer 100 (and each of chips 10 in wafer 100) includes semiconductor substrate 20, which may be a silicon substrate in some embodiments. Alternatively, semiconductor substrate 20 may comprise germanium, silicon germanium, a III-V compound semiconductor material, or the like. Interconnect structure 22 is formed on semiconductor substrate 20, which includes metal lines 30 and vias 32 formed in dielectric layers 24. Dielectric layers 24 may have low dielectric constants (k values), which may be lower than about 3.5, or lower than about 3.0, for example. Passivation layer(s) 26 are also included in chips 10, wherein passivation layers 26 may have non-low-k dielectric constants greater than 3.9.

In some embodiments, chips 10 are image sensors chips, which may further be Backside Illumination (BSI) image sensor chips. Chips 10 may include seal rings 14, wherein scribe line 12 is located between the seal rings 14 of neighboring chips 10. Each of seal rings 14 may extend from a surface of semiconductor substrate 20 through all of low-k dielectric layers 24, and may possibly extend into passivation layers 26. Seal rings 14 form solid metal rings adjacent to the peripheral region of the respective chips 10, so that moisture and detrimental chemicals may not penetrate into chips 10 and reach the devices and interconnect structure located within seal rings 14.

In some embodiments, metal features 16, which are formed in metal-pattern containing scribe line 12A, include test pad 34. Furthermore, metal features 16 may include metal lines 30 and vias 32. On the other hand, no metal lines 30, vias 32, and test pads 34 are formed in metal-pattern free scribe line 12B. Alternatively stated, dummy patterns, frame cells, or the like, when formed in scribe line 12, will also be disposed in metal-pattern containing scribe line 12A, and not in metal-pattern free scribe line 12B. Width W1 of metal-pattern containing scribe line 12A may be greater than about 20 μm, and is enough for forming metal features such as metal lines 30, vias 32, and test pads 34. Width W2 of metal-pattern free scribe line 12B may be greater than about 5 μm, and is big enough to accommodate the kerf of the die-saw, so that metal-pattern containing scribe line 12A and chips 10 are not sawed in the die-saw process. Width W2 may also be greater than thickness T1 of blade 45, which is used to saw wafer 100.

In some embodiments, chips 10 are BSI image sensor chips. Accordingly, chips 10 include photo sensors 36 in semiconductor substrate 20. Photo sensors 36 may be photo diodes in some embodiments, although photo sensors 36 may also be photo transistors. Upper dielectric layers 38 are formed on the backside of semiconductor substrate 20. In addition, color filters 40 and micro-lenses 42 are formed on the backside of, and over, semiconductor substrate 20. When chips 10 are BSI image sensor chips, semiconductor substrate 20 is thinned down to have a very small thickness, for example, as small as several microns or tens of microns. Accordingly, carrier 44 is bonded to wafer 100 to provide mechanical support, so that wafer 100 does not break in the formation of structures on the backside of wafer 100. Carrier 44 may be a blank silicon wafer including no circuits formed therein in accordance with some exemplary embodiments.

Figure 4:
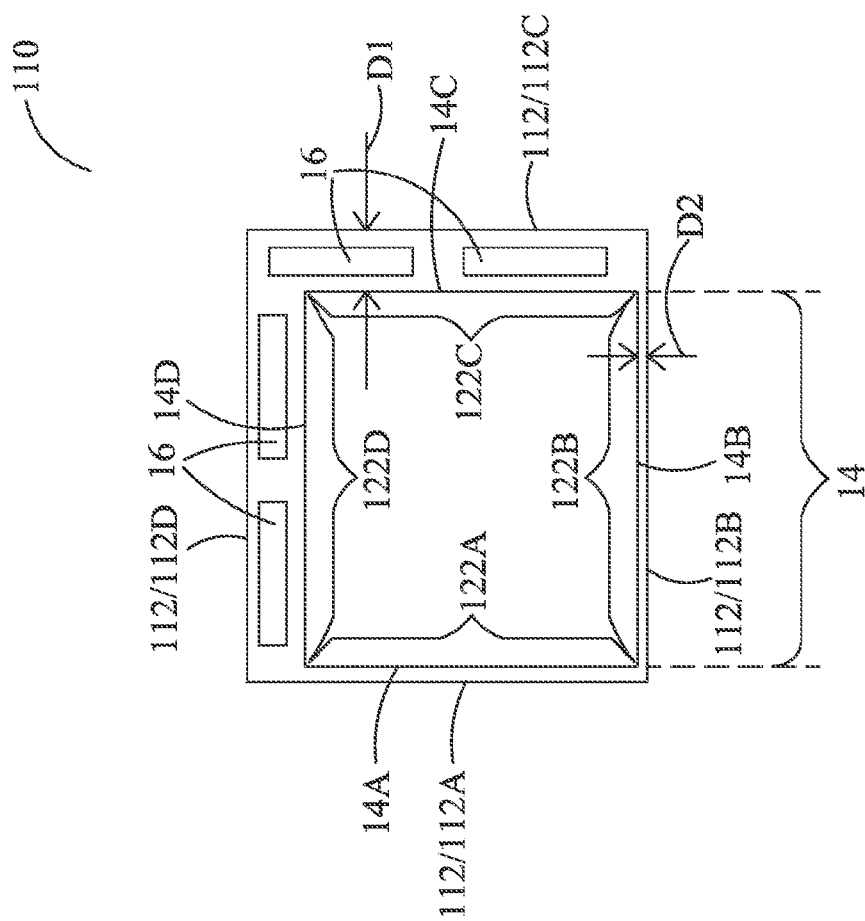
FIG. 4 illustrates a top view of a die sawed from the wafer shown in FIG. 1.

FIG. 2 also illustrates the die-saw process to saw apart wafer 100, so that chips 10 are separate from each other. In some exemplary embodiments, the die-saw process is performed using blade 45, which generates kerf 126. The resulting separated chips 10 are referred to as dies 110, wherein one of dies 110 is shown in FIG. 4. In the die-saw process, kerf 126 passes through metal-pattern free scribe line 12B, and does not pass metal-pattern containing scribe line 12A. Since there is no metal-containing feature in metal-pattern free scribe line 12B, the effect caused by the difference in the mechanical strengths of different materials that are sawed is reduced, and the likelihood of incurring low-k delamination and particle issues during the die-saw is reduced. The yield of the die-saw process is accordingly improved.

Figure 3:
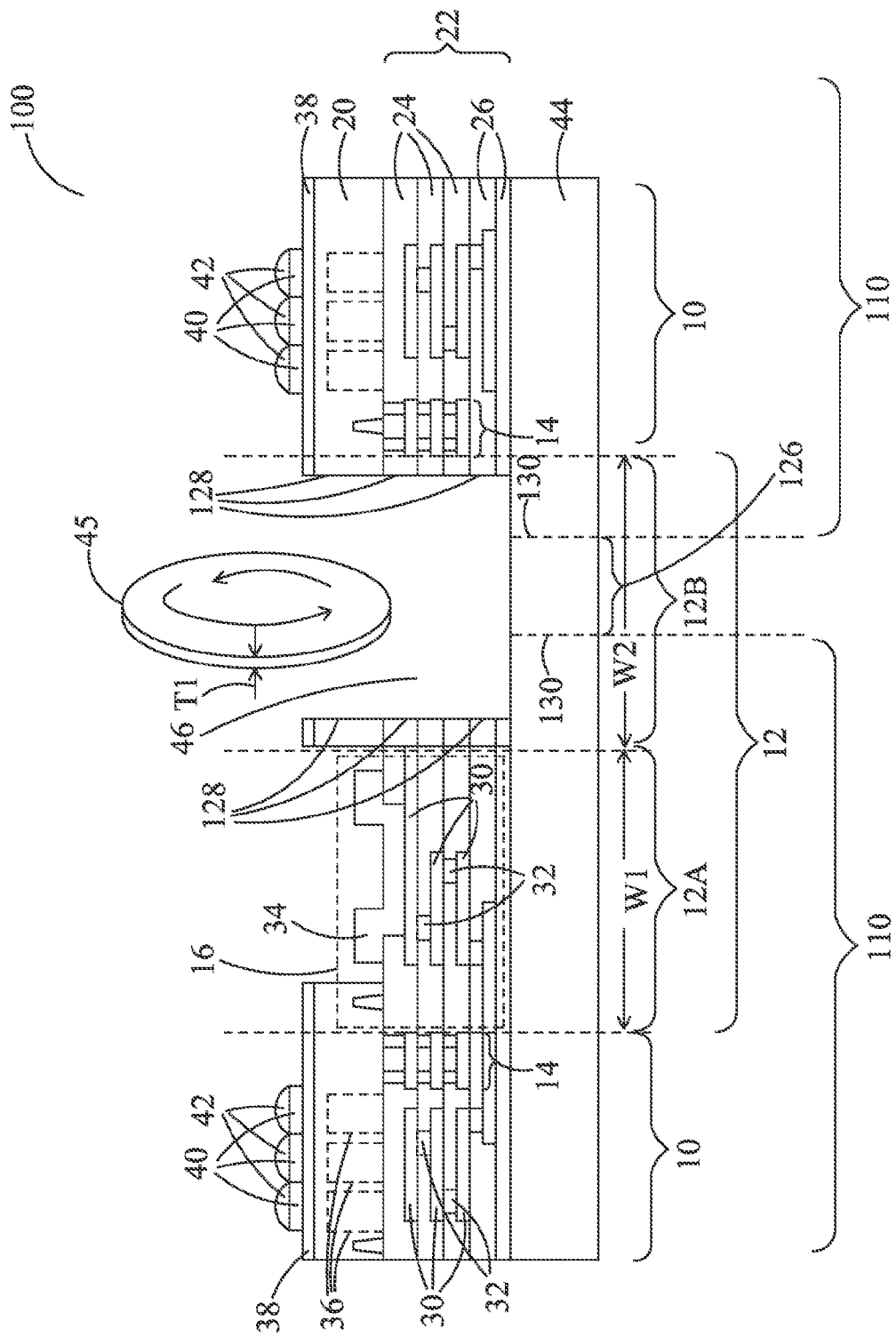

FIG. 3 illustrates the cross-sectional view of wafer 100 in accordance with yet alternative embodiments. These embodiments are essentially the same as in FIG. 2, except that prior to the die-saw process, a further etching step(s) is performed to etch upper layer 38, and semiconductor substrate 20. Dielectric layers 24 and 26 may also be, or may not be, etched. A trench 46 is thus formed in each of metal-pattern free scribe lines 12B. Since metal-pattern free scribe lines 12B form a grid, as shown in FIG. 1, trenches 46 are also formed to have a grid pattern. Trenches 46 are within metal-pattern free scribe lines 12B, and are not formed in metal-pattern containing scribe lines 12A and chips 10. After the formation of trenches 46 in wafer 100, the die-saw process is performed to saw wafer 100 apart into dies 110.

With kerf 126 being formed as a result of the die-saw, in the resulting dies 110 sawed from wafer 100 in FIG. 3, dies 110 include edges 128 that are misaligned to edge 130. In these embodiments, edges 128 are formed due to the etching of semiconductor substrate 20 and dielectric layers 24/26. Edges 128 thus include the edges of semiconductor substrate 20 and possibly the edges of dielectric layers 24 and 26. Edges 130 are the edges generated in the die-saw step, and are the edges of carrier 44.

Although FIGS. 2 and 3 illustrate BSI image sensor chips/wafers, the embodiments may also be applied to other type of chips/wafers. Accordingly, the wafers of other types, including, and not limited to, logic device wafers, memory device wafers, front illumination image sensor wafers, and the like, may also include the scribe lines 12 as shown in FIG. 1.

FIG. 4 illustrates a top view of one of dies 110. The illustrated exemplary die 110 has four edges 112, namely 112A, 112B, 112C, and 112D. The outmost seal ring 14 also has four sides 14A, 14B, 14C, and 14D, each parallel to, and adjacent to, one of edges 112A, 112B, 112C, and 112D, respectively. No metal features are located in an L-shaped region including die-edge region 122A and die-edge region 122B, wherein die-edge region 122A is between edge 112A and side 14A, and die-edge region 122B is between edge 112B and side 14B. On the other hand, metal features are located in the L-shaped region including die-edge region 122C and die-edge region 122D, wherein die-edge region 122C is between edge 112C and side 14C, and die-edge region 122D is between edge 112D and side 14D. In some exemplary embodiments, distance D1 between edge 112C and side 14C (or between edge 112D and side 14D) is greater than about 20 μm, and distance D2 between edge 112A and side 14A (or between edge 112B and side 14B) is greater than about 1 μm. Since during the die-saw of wafer 100, metal features 16 are not sawed through, in the resulting die 110, metal features 16 are spaced apart from edges 112 by a small distance, and no metal feature 16 is exposed through edges 112.

Figure 5:
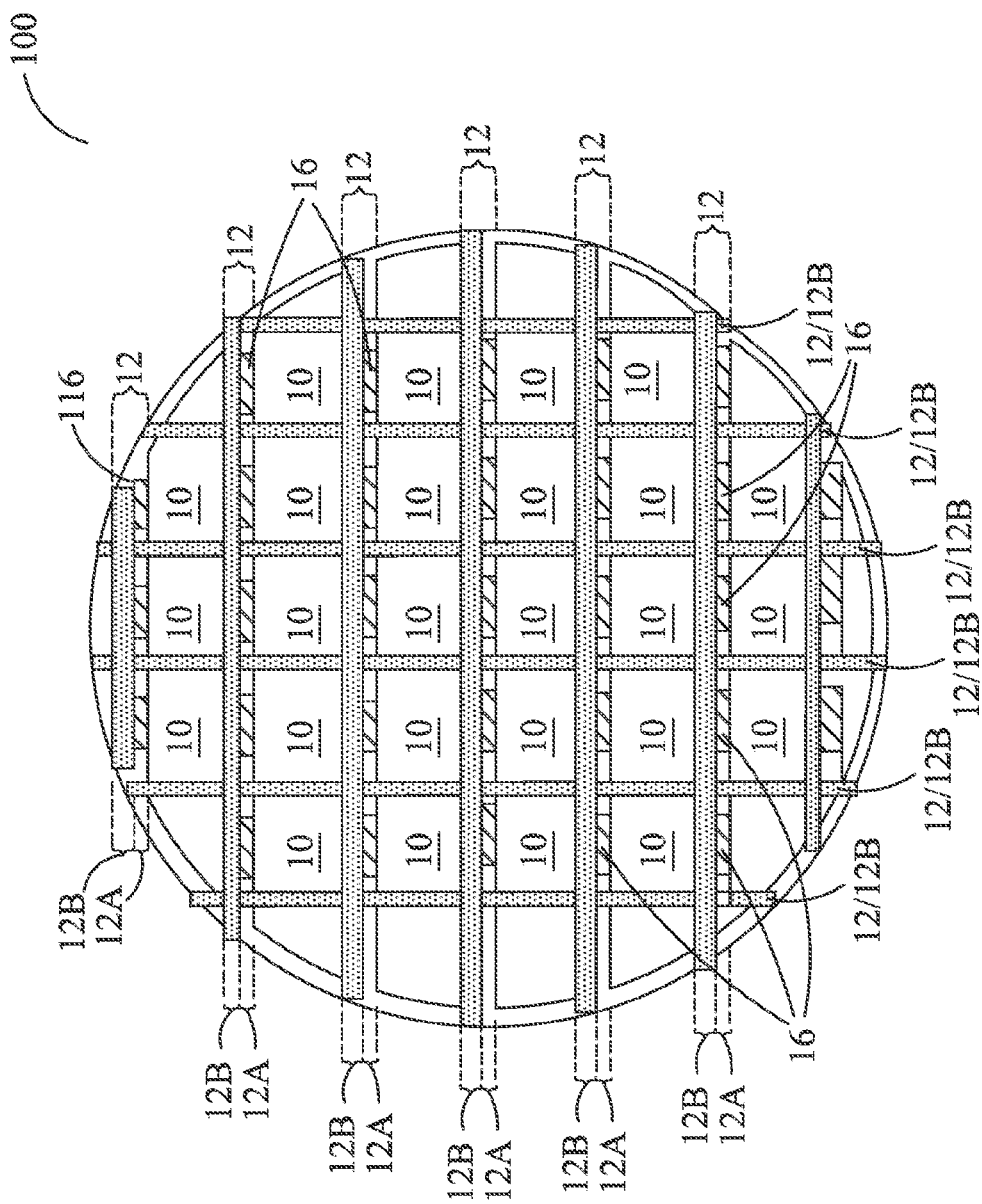
FIG. 5 illustrates a wafer in accordance with some alternative embodiments, wherein each of the scribe lines extending in the X direction includes a metal-pattern containing scribe line and a metal-pattern free scribe line, and wherein the scribe lines extending in the Y direction do not include metal patterns.

In the embodiments shown in FIG. 1, metal-pattern containing scribe lines 12A are formed in both the scribe lines extending in the row direction (the illustrated X direction) and the column direction (the illustrated Y direction) of wafer 100. In alternative embodiments, as shown in FIG. 5, metal-pattern containing scribe lines 12A are formed in the row direction, and not in the column direction. Accordingly, in the scribe lines 12 extending in the Y direction, no metal-pattern containing scribe lines 12A are included, and metal-pattern free scribe lines 12B occupy the entirety of the scribe lines 12 that extend in the Y direction, as shown in FIG. 5.

In the embodiments, by dividing scribe lines into metal-pattern free scribe lines 12B and metal-pattern containing scribe lines 12A, the metal features in scribe lines 12 are not sawed in the die-saw process. The damage to the low-k dielectric layers is accordingly avoided. Furthermore, the problems caused by the particles generated in the die-saw process are also avoided.

In accordance with embodiments, a wafer includes a plurality of chips arranged as rows and columns. A first plurality of scribe lines is between the rows of the plurality of chips. Each of the first plurality of scribe lines includes a metal-feature containing scribe line comprising metal features therein, and a metal-feature free scribe line parallel to, and adjoining, the metal-feature containing scribe line. A second plurality of scribe lines is between the columns of the plurality of chips.

In accordance with other embodiments, a die includes a first, a second, a third, and a fourth edge. A seal ring in the die includes a first, a second, a third, and a fourth side, wherein the first, the second, the third, and the fourth sides are parallel to, and are adjacent to, the first, the second, the third, and the fourth edges, respectively. A first die-edge region is between the first side and the first edge, wherein no metal feature is formed in the first die-edge region. A second die-edge region is between the second side and the second edge, wherein metal features are formed in the second die-edge region. No metal features in the second die-edge region are exposed through the second edge of the die.

In accordance with yet other embodiments, a method includes sawing a wafer along a first metal-feature free scribe line. The wafer further includes a first metal-feature containing scribe line, wherein the first metal-feature containing scribe line is between, and adjoining, the first metal-feature free scribe line and a row of chips in the wafer. The method further includes sawing the wafer along a second metal-feature free scribe line perpendicular to the first metal-feature free scribe line.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A wafer comprising:
a semiconductor substrate;
a plurality of chips arranged as rows and columns, with the semiconductor substrate extending into the plurality of chips;
a first plurality of scribe lines between the rows of the plurality of chips, wherein each of the first plurality of scribe lines comprises:
a metal-feature containing scribe line comprising metal features therein; and
a metal-feature free scribe line parallel to, and adjoining, the metal-feature containing scribe line;
a second plurality of scribe lines between the columns of the plurality of chips;
a trench penetrating through a plurality of dielectric layers in the metal-feature free scribe line, wherein the trench further penetrates through the semiconductor substrate; and
a carrier bonded to the plurality of dielectric layers, wherein the trench does not extend into the carrier.

2. The wafer of claim 1, wherein each of the second plurality of scribe lines comprises:
an additional metal-feature containing scribe line comprising metal features therein, wherein the additional metal-feature containing scribe line comprises test pads; and
an additional metal-feature free scribe line parallel to, and adjoining, the additional metal-feature containing scribe line.

3. The wafer of claim 1, wherein each of the second plurality of scribe lines is substantially free from metal features therein.

4. The wafer of claim 1 further comprising:
a plurality of image sensors in the semiconductor substrate and in each of the plurality of chips.

5. The wafer of claim 1, wherein the metal features comprise test pads.

6. The wafer of claim 5, wherein the metal features in the metal-feature containing scribe line further comprises conductive features selected from the group consisting essentially of metal lines, vias, and combinations thereof.

7. The wafer of claim 1, wherein the metal-feature containing scribe line adjoins a first seal ring, and the metal-feature free scribe line adjoins a second seal ring, and wherein the first seal ring and the second seal ring are in a first and a second chip, respectively, in the plurality of chips.

8. The wafer of claim 7, wherein the first seal ring and the second seal ring are in a first chip and a second chip, respectively, of the plurality of chips, with the first chip and the second chip being in a same column, wherein no additional metal feature is between the metal features and the second seal ring, and wherein the metal features are farther away from the second seal ring than from the first seal ring.

9. A wafer comprising:
a plurality of chips arranged as rows and columns, wherein each of the chips comprises;
a seal ring in the each of the plurality of chips and comprising a first, a second, a third, and a fourth side, with the first side and the third side being opposite to each other, and the second side and the fourth side being opposite to each other;
a first plurality of scribe lines between the rows of the plurality of chips, wherein each of the first plurality of scribe lines is between a first row and a second row of the plurality of scribe lines, and wherein the each of the first plurality of scribe lines comprises:
a metal-feature containing scribe line comprising metal features therein, wherein the metal features comprise test pads, wherein the metal-feature containing scribe line comprises a first edge contacting outer edges of the seal rings in the first row of the plurality of chips, and a second edge opposite to the first edge; and
a metal-feature free scribe line parallel to, and adjoining, the metal-feature containing scribe line, wherein the metal-feature free scribe line comprises a first edge contacting the second edge of the metal-feature containing scribe line, and a second edge contacting outer edges of the seal rings in the second row of the plurality of chips; and a second plurality of scribe lines between the columns of the plurality of chips.

10. The wafer of claim 9, wherein the each of the plurality of chips further comprises:
    a semiconductor substrate comprising a first portion in the seal ring and a second portion outside the seal ring; and
    a plurality of image sensors in the semiconductor substrate.

11. The wafer of claim 9, wherein each of the first plurality of scribe lines and the second plurality of scribe lines extends from an edge of the wafer to a respective opposite edge of the wafer.

12. The wafer of claim 9, wherein the metal-feature containing scribe line adjoins a first seal ring, and the metal-feature free scribe line adjoins a second seal ring, with the first seal ring and the second seal ring being in a first and a second chip, respectively, in the plurality of chips, wherein no additional metal feature is between the metal features and the second seal ring, and wherein the metal features are farther away from the second seal ring than from the first seal ring.

13. The wafer of claim 9, wherein the metal-feature free scribe lines in the first plurality of scribe lines are on a same side of the respective metal-feature free scribe lines that are in same ones of the first plurality of scribe lines.

14. The wafer of claim 9, wherein the metal-feature containing scribe line comprises portions of a plurality of dielectric layers, and wherein the metal-feature free scribe line comprises a trench extending into the plurality of dielectric layers.

15. The wafer of claim 9, wherein each of the second plurality of scribe lines comprises:
    an additional metal-feature containing scribe line comprising metal features therein; and
    an additional metal-feature free scribe line parallel to, and adjoining, the additional metal-feature containing scribe line.

16. The wafer of claim 9 further comprising:
    a semiconductor substrate extending into the plurality of chips and the first plurality of scribe lines;
    a trench penetrating through a plurality of dielectric layers in the metal-feature free scribe lines of the plurality of scribe lines, wherein the trench further penetrates through the semiconductor substrate; and
    a carrier bonded to the plurality of dielectric layers, with the carrier exposed to the trench, wherein the trench does not extend into the carrier.

17. A wafer comprising:
    a plurality of chips arranged as rows and columns; and
    a first plurality of scribe lines between the rows of the plurality of chips, wherein each of the first plurality of scribe lines comprises:
        a metal-feature containing scribe line comprising metal features therein, wherein the metal features comprise test pads, wherein the metal-feature containing scribe line adjoins a first seal ring, with the first seal ring in a first chip of the plurality of chips; and
        a metal-feature free scribe line parallel to, and adjoining, the metal-feature containing scribe line, wherein the metal-feature free scribe line is free from metal features therein, wherein the metal-feature free scribe line adjoins a second seal ring of a second chip of the plurality of chips, wherein the first chip and the second chip are in a same column, and wherein the metal features are farther away from the second seal ring than from the first seal ring, with no additional metal features between the metal features and the second seal ring.

18. The wafer of claim 17, wherein the metal-feature free scribe line has a width greater than about 5 µm.

19. The wafer of claim 17 further comprising:
    a second plurality of scribe lines between the columns of the plurality of chips, wherein each of the second plurality of scribe lines comprises:
        an additional metal-feature containing scribe line comprising additional metal features therein; and
        an additional metal-feature free scribe line parallel to, and adjoining, the additional metal-feature containing scribe line, wherein the additional metal-feature free scribe line is free from metal features therein.

20. The wafer of claim 17 further comprising:
    a semiconductor substrate extending into the plurality of chips and the first plurality of scribe lines;
    a trench penetrating through a plurality of dielectric layers in the metal-feature free scribe lines of the first plurality of scribe lines, wherein the trench further penetrates through the semiconductor substrate; and
    a carrier bonded to the plurality of dielectric layers, with the carrier exposed to the trench, wherein the trench does not extend into the carrier.

\* \* \* \* \*